(12) United States Patent
Pileggi et al.

(10) Patent No.: US 6,633,182 B2
(45) Date of Patent: Oct. 14, 2003

(54) PROGRAMMABLE GATE ARRAY BASED ON CONFIGURABLE METAL INTERCONNECT VIAS

(75) Inventors: Larry Pileggi, Pittsburgh, PA (US); Herman Schmit, Pittsbugh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 09/947,289

(22) Filed: Sep. 5, 2001

(65) Prior Publication Data

US 2003/0042930 A1 Mar. 6, 2003

(51) Int. Cl.[7] .................................................. H03K 7/38
(52) U.S. Cl. .......................................... 326/41; 326/38
(58) Field of Search ...................................... 326/37–41

(56) References Cited

U.S. PATENT DOCUMENTS

| | | | |
|---|---|---|---|
| 4,197,555 A | * 4/1980 | Uehara et al. | ............... 257/209 |
| 4,422,072 A | 12/1983 | Cavlan | |
| 4,569,121 A | 2/1986 | Lim et al. | |
| 5,068,603 A | 11/1991 | Mahoney | |
| 5,070,384 A | 12/1991 | McCollum et al. | |
| 5,093,711 A | 3/1992 | Hirakawa | |
| 5,099,149 A | 3/1992 | Smith | |
| 5,187,393 A | 2/1993 | El Gamal et al. | |
| 5,550,839 A | 8/1996 | Buch et al. | |
| 5,581,098 A | * 12/1996 | Chang | ........................ 257/208 |
| 5,698,992 A | 12/1997 | El Ayat et al. | |
| 5,825,202 A | 10/1998 | Tavana et al. | |
| 5,874,834 A | 2/1999 | New | |
| 6,091,262 A | 7/2000 | New | |
| 6,150,837 A | 11/2000 | Beal et al. | |
| 6,194,912 B1 | 2/2001 | Or-Bach | |
| 6,236,229 B1 | 5/2001 | Or-Bach | |
| 6,242,945 B1 | 6/2001 | New | |
| 6,245,634 B1 | 6/2001 | Or-Bach | |
| 6,278,291 B1 | 8/2001 | McClintock et al. | |

FOREIGN PATENT DOCUMENTS

| | | |
|---|---|---|
| EP | 0 463 301 A2 | 1/1992 |
| EP | 0 592 111 A2 | 4/1994 |
| EP | 1 179 790 A1 | 2/2002 |

OTHER PUBLICATIONS

International Search Report, International Application No. PCT/US 02/28008, International Search Date Oct. 23, 2002, European Patent Office, P.B. 5818, Patentiaan 2, NL—2880 HV Rijswijk.

* cited by examiner

Primary Examiner—Don Le
(74) Attorney, Agent, or Firm—Thorp Reed & Armstrong, LLP

(57) ABSTRACT

A method is comprised of translating a bit stream defining the state of switches of an FPGA into a set of via geometries, or generating the set of via geometries directly from a physical design system. The via geometries are used to produce at least one via mask. The via mask is then used in a manufacturing process to customize an array of fixed and/or programmable logic blocks.

5 Claims, 6 Drawing Sheets

PROGRAMMABLE GATE ARRAY BASED ON CONFIGURABLE METAL INTERCONNECT VIAS

BACKGROUND OF THE INVENTION

1. Field of the Invention

The present invention is directed to integrated circuits and, more particularly, to arrays of devices that are field or mask programmable.

2. Description of the Background

Field programmable gate arrays (FPGA), as the name implies, are user programmable after the manufacturing process is completed. An FPGA typically includes a two dimensional array of configurable logic blocks (CLBs) distributed over the chip. Each of these CLBs includes a block of configurable logic elements (CLEs) and corresponding programmable routing resources. The routing resources associated with the various CLBs can be programmed by the user to provide various connections among the CLEs. In addition, the user can program the CLEs to implement different functions.

The flexibility provided by FPGAs comes at the cost of logic density. For example, suppose that certain CLBs are configured to implement an adder function having a certain number of bits. The CLBs required to implement such an adder function will have a larger layout area than a dedicated adder function having the same number of bits. Thus, FPGAs exhibit a reduced logic density with respect to dedicated circuits because of the additional resources required to provide the routing resources needed so that the CLEs can be user programmable.

It has been recognized that a user programmable interconnect technique or manufacturer programmability just prior to shipment would allow lower tooling costs and faster delivery times. To such an end, gate arrays were developed as an alternative to FPGAs. Non-field programmable gate arrays can be programmed to implement application specific functions. The function of a non-field programmable gate array is defined during the later stages of manufacture, after a defined pattern of transistors has been formed. An example of a non-field programmable gate array is a sea-of-gates (SOG) gate array, which is a mask programmed gate array.

An SOG gate array, in which a pattern of transistors are interconnected by custom patterns of metal lines, has a significantly higher logic density than an FPGA. In an SOG gate array, a predefined pattern of transistors is connected directly with user-defined metal, both to form gates and to interconnect those gates. Consequently, the extensive programmable routing resources required for an FPGA are not present in an SOG gate array. However, non-field programmable gate arrays, such as SOG gate arrays, are inflexible in that they do not provide for field programmability.

It has been recognized that an application specific logic area ASLA may be an equivalent of an FPGA. See, for example, U.S. Pat. No. 5,825,202, U.S. Pat. No. 5,068,603, and U.S. Pat. No. 5,550,893. While those patents recognize the relationship between an ASLA and a FPGA, they do not provide an easily implemented mechanism for producing an ASLA from a FPGA that has been programmed to implement a specific function. Therefore, the need exists for a method and apparatus to easily translate a programmed FPGA to an equivalent ASLA.

SUMMARY OF THE PRESENT INVENTION

The present invention is directed to a "via-programmable" gate array (VPGA). A via is a cut manufactured between two metal layers on an integrated circuit to electrically interconnect two segments of metal on those different layers. A VPGA differs from an FPGA in that the programmability in a VPGA is provided by modification of placement of vias rather than data bits stored in a memory. In the interconnect structure of a VPGA, the programmable interconnect point is a single via, which replaces four to eight transistors in an FPGA. The vias may be used to interconnect logic functions or to implement logic functions.

Another aspect of the present invention allows for the construction of a VPGA whose architecture mimics the architecture of an existing FPGA, with some or all of the field programmability replaced by via-programmability. The proposed architecture of the VPGA is designed such that the corresponding FPGA can be used for design prototyping and the VPGA can use the same bit stream to produce a more robust, higher performance, lower cost integrated circuit or system. The FPGA bitstream is converted to a set of via masks for manufacturing the VPGA.

Another aspect of the present invention is the use of via programmable switch boxes that allow one layer of metal to be connected to another layer of metal through the use of vias without creating dangling wires or adding unnecessary capacitance to the lines. Those, and other advantages and benefits will become apparent from the Description of the Preferred Embodiments herein below.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 1:
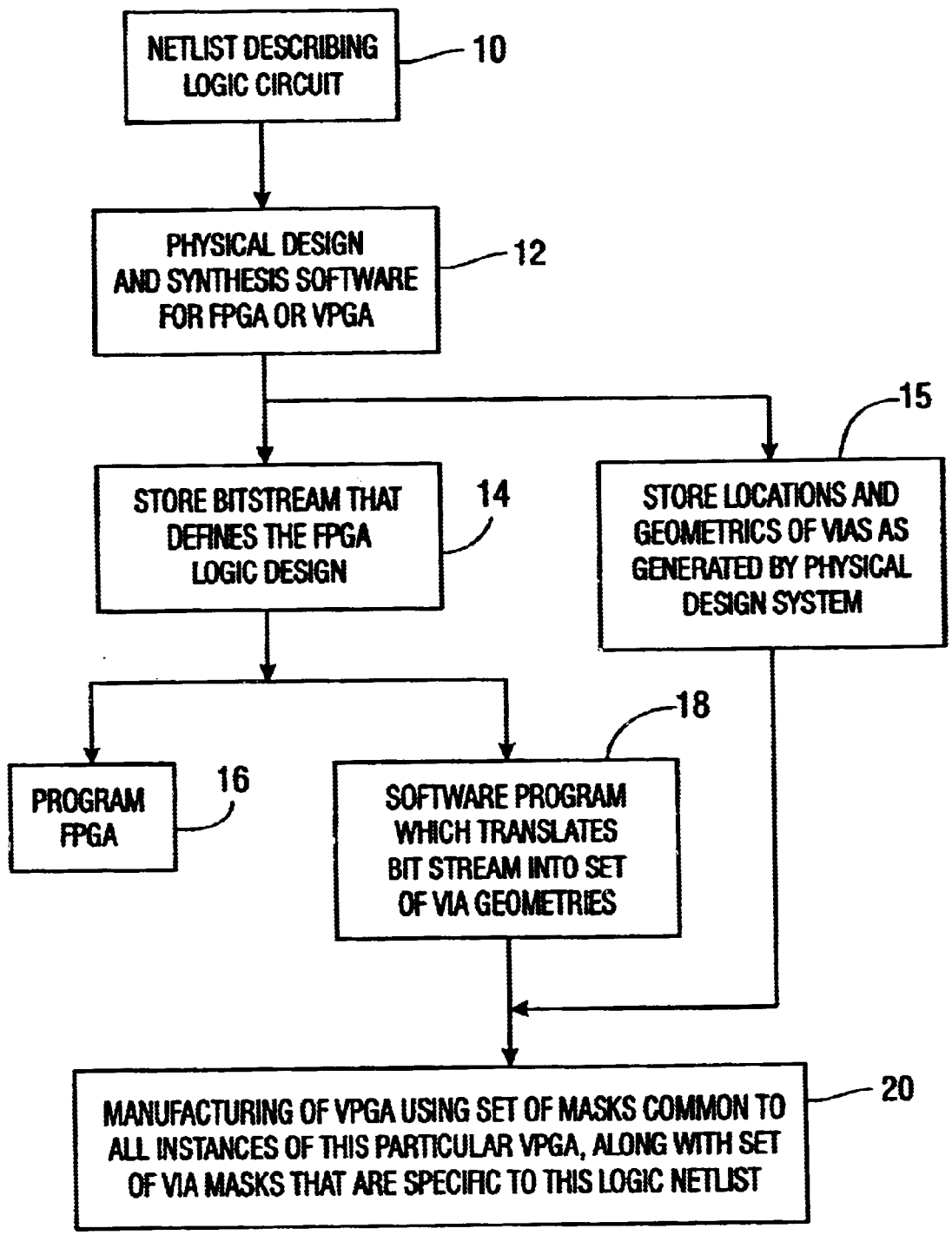
FIG. 1 is a flow chart illustrating the methodology of the present invention.

FIG. 1 illustrates the methodology of the present invention. In FIG. 1, the process begins at step 10 with the creation of a netlist describing the functioning of the logic circuit. The netlist is operated on by known physical design and synthesis software programs at step 12. The synthesis program maps the requirements set forth on the netlist into a set of components or logic blocks, while the physical design determines which functions are implemented by which blocks. The physical design program determines the state of the transistors within a FPGA or the location of vias within a VPGA. The state of the FPGA is defined by a bitstream, which is a series 1s and 0s. Each bit in the bitstream corresponds to some function in the FPGA. For example, a "1" in a certain location in the bitstream might indicate that an active device should connect two different conductors, or a "0" might mean that the output of a logic gate is zero under a certain input condition. The bitstream is an encoding of the user's logic design for a particular FPGA.

That bitstream is stored at step 14 in a file, for example, on a disk or in a portion of memory in a computer. Alternatively, if the physical design software is applied to a VPGA, then at step 15 the locations and geometries of the vias are stored.

The bitstream stored at step 14 may be used to program a conventional FPGA as shown by step 16. The FPGA can be reprogrammed several times until optimal operation, defined by an optimal bitstream, is achieved.

One aspect of the present invention is to use the bitstream stored at step 14, which preferably is an optimal bitstream, at step 18 to create a set of via geometries. At step 18, a program, described in greater detail in conjunction with FIG. 2, translates the bit stream that defines the state of the FPGA switches into a set of via geometries. The via geometries either from step 15 or step 18 are then used to create a set of masks that define a set of vias that provide the same logical interconnection between devices as the bitstream provides to the FPGA at step 16.

At step 20 a VPGA is manufactured. The fabrication process begins with a set of standard masks common to all instances of the particular VPGA being manufactured. The custom via masks created at step 18 are used to specify logic functions performed by logic elements and interconnect the various logic elements thereby eliminating, or reducing to the extent desired, the need for programmable logic elements and programmable connections between the logic elements. The use of the via masks allows for higher functional density and better performance than either an FPGA or a one time programmable device. Furthermore, the VPGA requires substantially less verification and design rule checking than does an application specific integrated circuit (ASIC). Additionally, a VPGA does not suffer from the need for redesign based on errors that are made during routing. The limited number of masks required for a VPGA provide a satisfactory performance versus cost compromise between an FPGA and a fully customized ASIC. And because the via mask can be created from the same bit stream used to program the FPGA, the need for further logic design and verification on the VPGA is eliminated.

Figure 2:
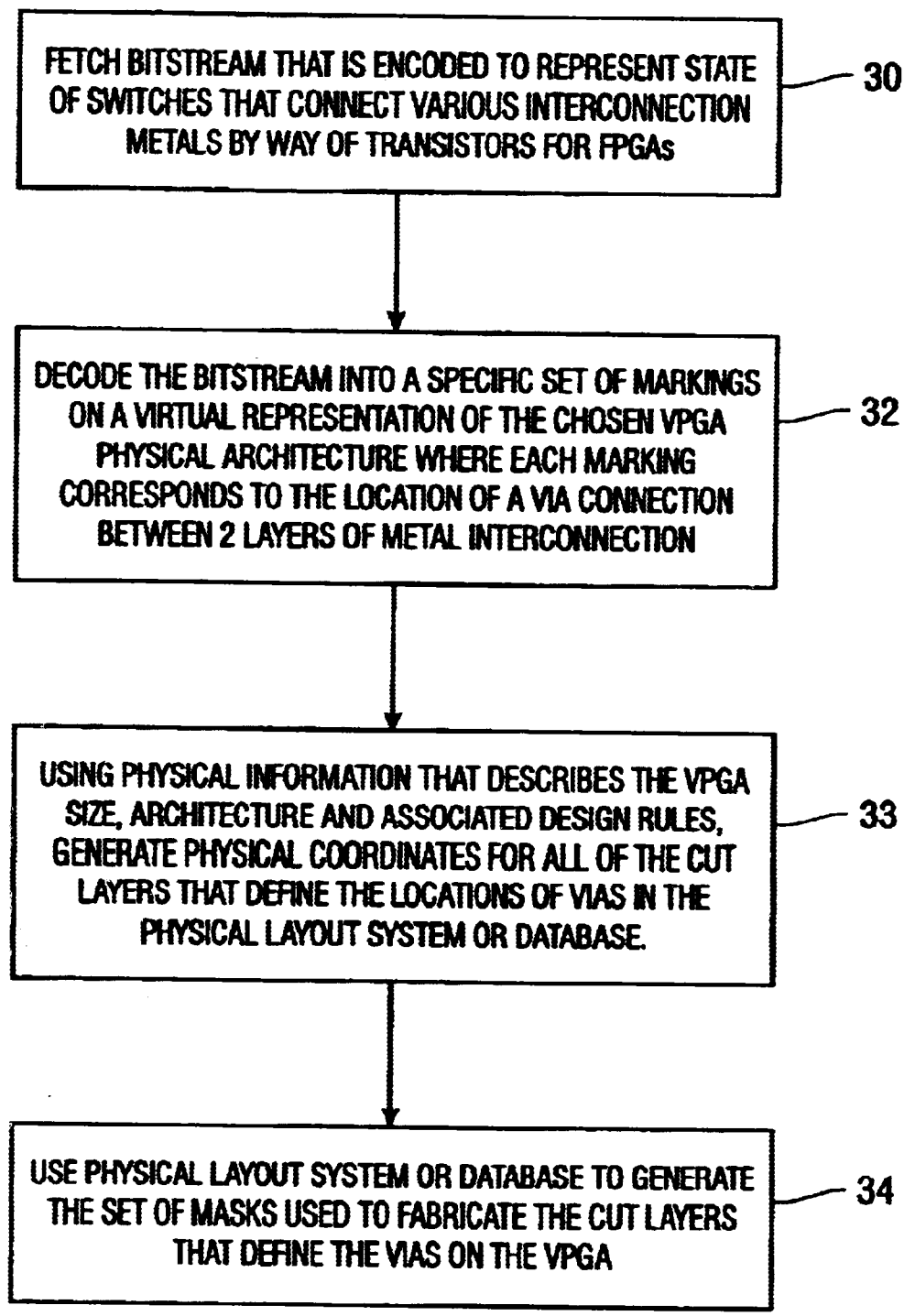
FIG. 2 is a flow chart illustrating the software for translating the bit stream into via geometries.

FIG. 2 is a flow chart illustrating one implementation of the software of step 18 for translating the bit stream into via geometries. The first step is step 30 in which the bitstream representing the state of a FPGA is fetched and stored in memory. At step 32, the bitstream is decoded into a specific set of markings on a virtual representation of the chosen VPGA physical architecture. Each marking corresponds to the location of a via connecting two different layers of metal interconnections. At step 33, using physical information that describes the gate array size, architecture and associated design rules, physical coordinates are generated for each mark in the virtual representation identifying the location in each of the layers to be cut or opened for each via. Information should be in a standard format that is readable by a physical layout design system for integrated circuits.

At step 34, a physical layout system or database is used to generate a set of masks used to fabricated the vias on the gate array to produce a via-programmed gate array.

Figure 3:
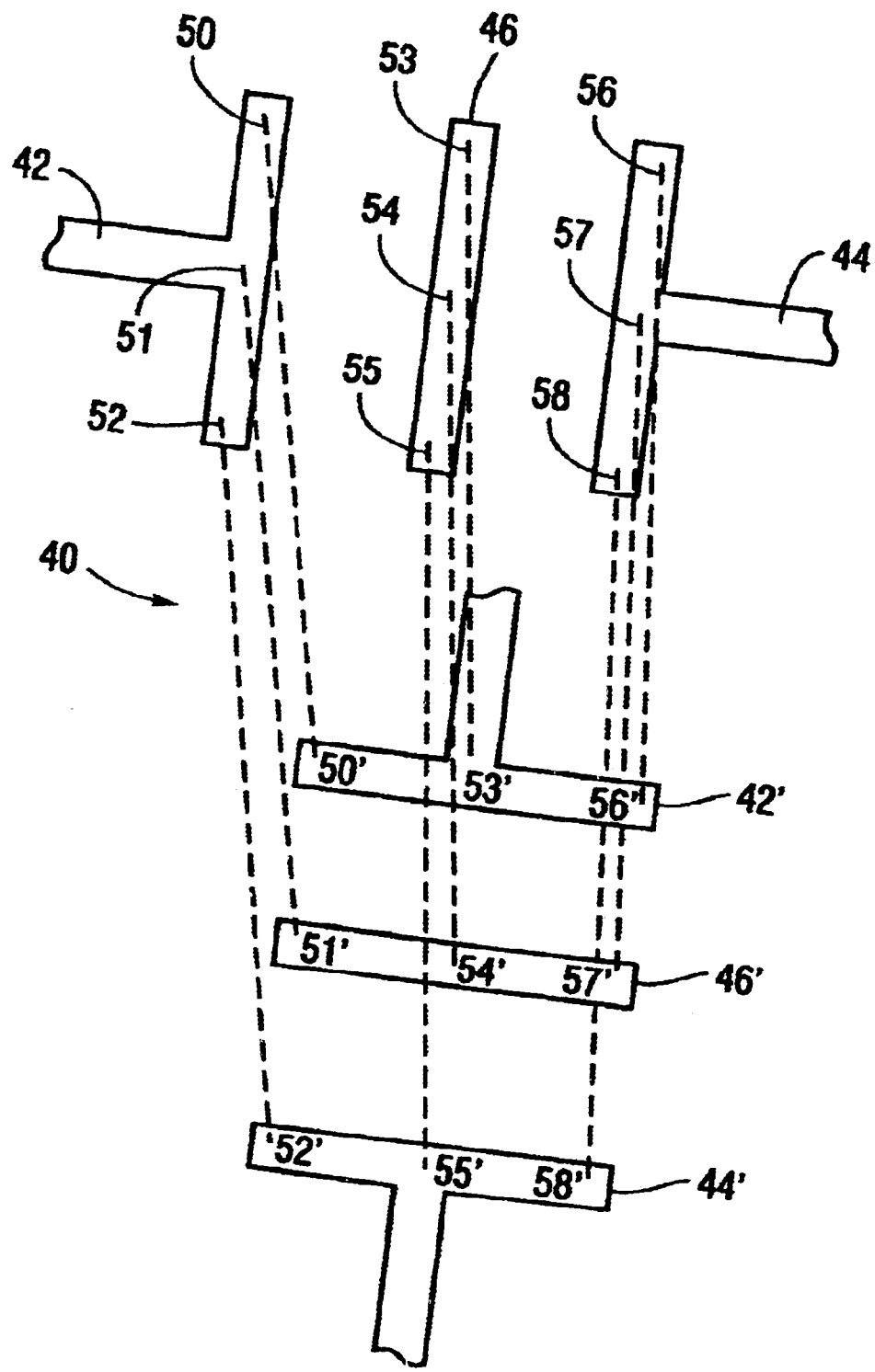
FIG. 3 illustrates a connection block where metal runs can be interconnected through vias.

Turning now to FIG. 3, FIG. 3 illustrates one example of a connection block 40 constructed according to the teachings of the present invention where metal runs can be interconnected using vias. The connection block 40 has a first major conductor 42 extending from the left as shown in the figure and terminating in, for example, a "T" configuration. A second major conductor 44 terminates with, for example, a "T" configuration, and extends to the right as shown in the figure. A connection member 46 is positioned between the Ts of the conductors 42, 44. The conductors 42, 44 and the connection member 46 are comprised of metal and may be, for example, fabricated in metal layer five.

Figure 4:
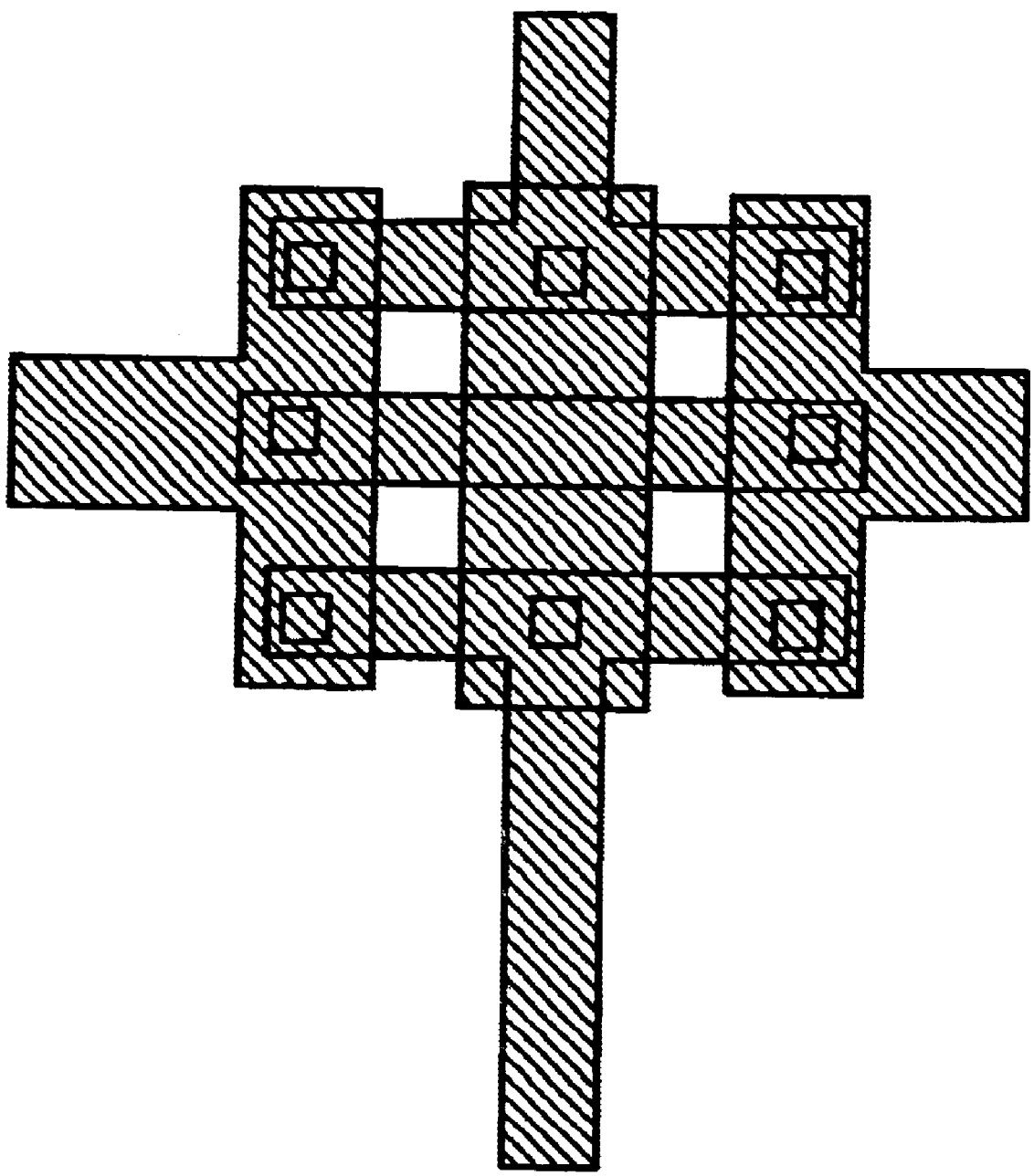
FIG. 4 is another view of the connection block of FIG. 3.

The connection block 40 is constructed of a second structure which may be identical to the structure just describe, but fabricated in metal layer 6, and rotated clockwise ninety degrees as shown by third major conductor 42', connection member 46' and fourth major conductor 44'. Potential vias at locations 50' on conductor 42', at location 51 ' on connection member 46' and at location 52' on conductor 44' connect to the underlying metal layer five on conductor 42 at locations 50, 51, and 52, respectively. Similarly, potential vias at locations 53' on conductor 42', at location 54' on connection member 46' and at location 55' on conductor 44' connect to the underlying metal layer five on connection member 46 at locations 53, 54, and 55, respectively. Finally, potential vias at locations 56' on conductor 42', at location 57' on connection member 46' and at location 58' on conductor 44' connect to the underlying metal layer five on conductor 44 at locations 56, 57, and 58, respectively. Another view of the connection block 40 can be seen in FIG. 4

An examination of FIG. 3 illustrates how connections can be made between metal layers five and six. For example, a signal on conductor 42' can be "switched", i.e. connected, to conductor 42 by fabricating a via at location 50'–50; a signal on conductor 42 can be switched to conductor 44 by fabricating vias at locations 51–51 ' and 57'–57. As can be seen, these exemplary connections can be performed such that there are no conductors having substantial portions extending beyond the connection, thereby eliminating the so called dangling wire problem and associated problems of unwanted capacitance.

Other connection block configurations are possible. For example, other major conductors could terminate in the connection block, and terminations may be by configurations other than a T configuration, e.g. L shaped termination.

Figure 5:
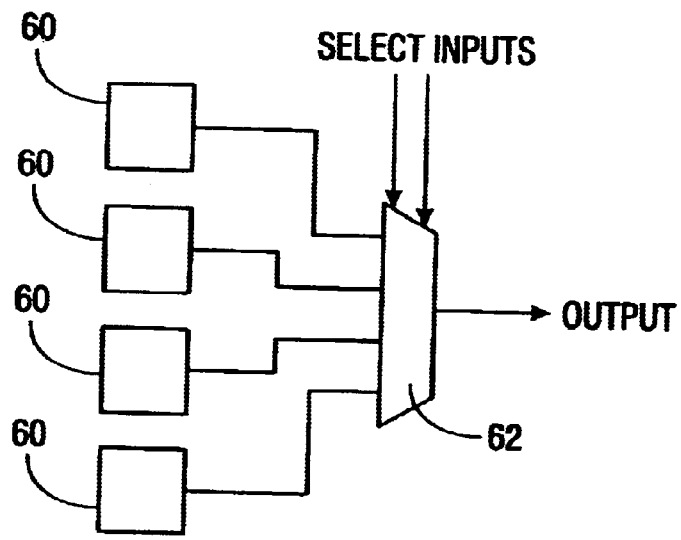
FIG. 5 illustrates a prior art implementation of a lookup table.

FIG. 5 illustrates the implementation of a lookup table, which is used as the logic element of many FPGAs. In FIG. 5, the configuration storage elements 60 store the truth table for a user-defined logic function. The storage elements 60 are loaded by the user through configuration circuitry with values of one or zero. The outputs of the configuration storage elements connect to the inputs of a multiplexor 62. The selected inputs to the multiplexor 62 come from the programmable interconnect. This implementation of a programmable logic element allows a user to specify any logic function on the inputs to the lookup table.

Figure 6:
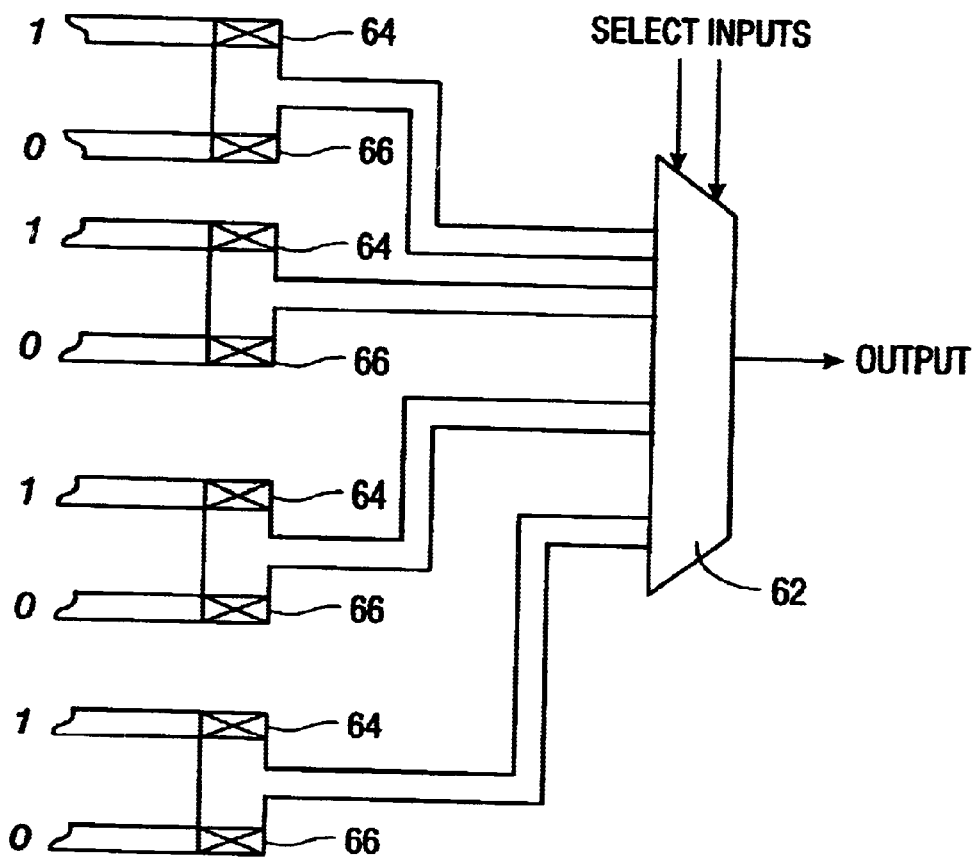
FIG. 6 illustrates a via equivalent of the implementation of FIG. 5.

FIG. 6 illustrates a via-programmable equivalent of a lookup table as shown in FIG. 5. FIG. 6 differs from FIG. 5 in that the configuration storage elements have been replaced by two potential via locations 64 and 66. If a via is placed at location 64 in the fabrication mask, a value of one will be output whenever that input pattern is selected by the multiplexor 62. If a via is placed at location 66 in the fabrication mask, a value of zero will be output whenever that input pattern is selected by the multiplexor 62. In that way, there is a one-to-one correspondence between bits in the FPGA bitstream and via locations in the VPGA.

Figure 7:
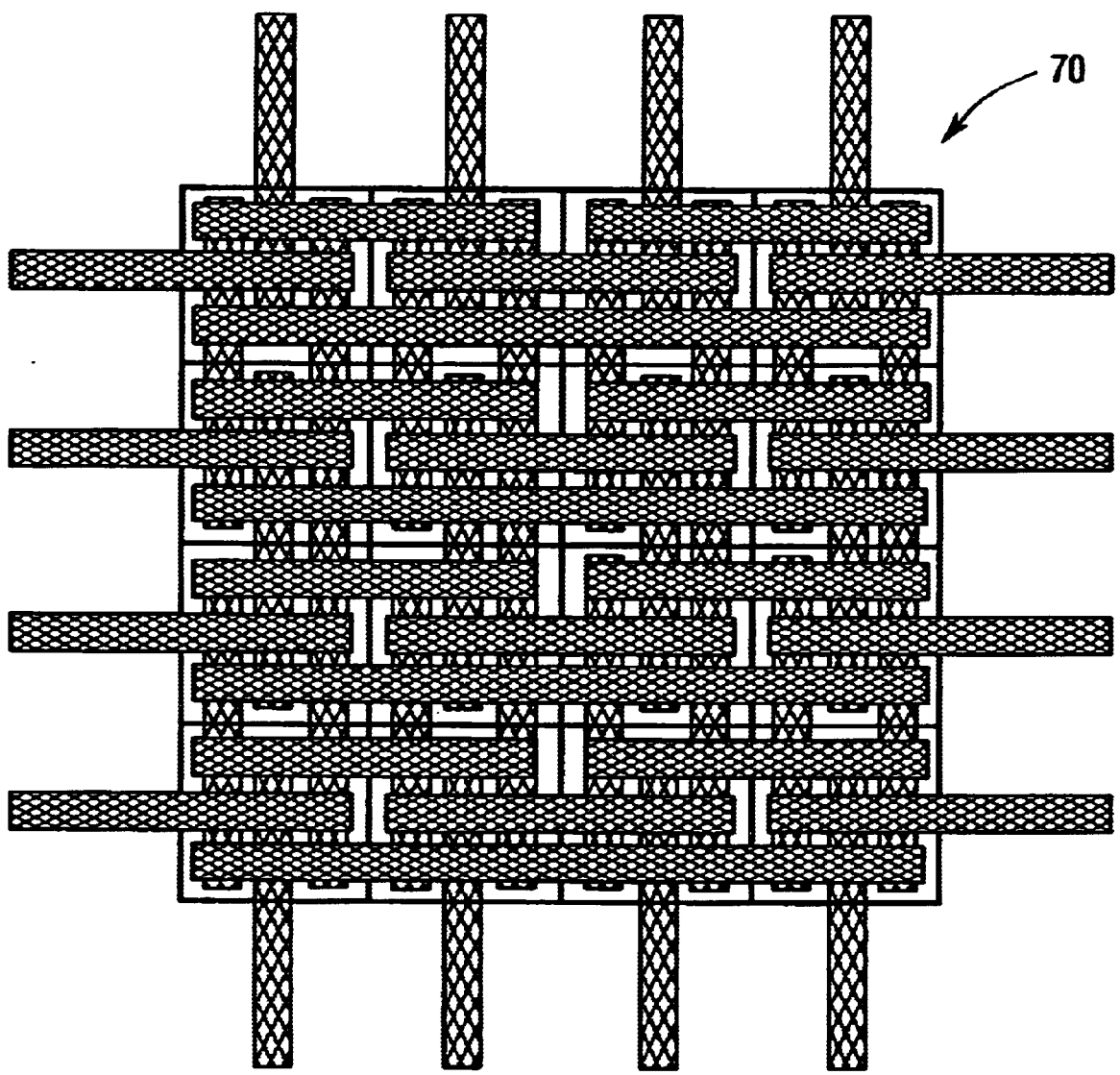
FIG. 7 illustrates a completed device.

FIG. 7 illustrates a VPGA 70. The VPGA 70 is implemented with a minimized number of masks and implementation complexities. For example, customization of metal masks requires DRC, noise, DFM analysis, etc., which may be eliminated by the present invention. However, both performance and density are superior to an FPGA. By utilizing a VPGA, the density of an ASIC is achieved with the regularity of an FPGA. Other benefits include: mask amortization, predesigned power and clock signals, higher yields due to, for example, regularized metal patterns, as well as simplified design and verification flow.

While the present invention has been described in conjunction with preferred embodiments thereof, those of ordinary skill in the art will recognize that modifications and variations in addition to those already discussed are possible. The present invention is intended to include such modifications and variations and is intended to be limited only by the following claims.

What is claimed is:

1. A method, comprising:

translating a bit stream defining the logical design of an FPGA into a set of via geometries; and producing at least one via mask based on said set of geometries.

2. The method of claim 1 additionally comprising modifying the bit stream to obtain one of a desired operation and a desired level of performance from the FPGA before said translating.

3. A method, comprising:

producing a via mask defining physical connections between devices in a gate array from a table of values defining the configuration bitstream of an FPGA.

4. The method of either claim 1 or 3 additionally comprising:

fabricating from a plurality of common masks programmable logic elements and unconnected wires; and fabricating a set of vias using said via mask to define the logic functions performed by said programmable logic elements and interconnect said plurality of programmable logic elements to implement a customized function.

5. A program for translating a bitstream into via mask geometries, comprising:

decoding the bitstream into a set of markings on a virtual representation of the gate array;

generating physical coordinates for each of the virtual markings; and generating a series of masks needed to fabricate a via at each of said physical coordinates.

* * * * *